(12) United States Patent
Fornara et al.

(10) Patent No.: US 9,331,027 B2
(45) Date of Patent: May 3, 2016

(54) METHOD FOR DETECTING ELECTRICAL ENERGY PRODUCED FROM A THERMOELECTRIC MATERIAL CONTAINED IN AN INTEGRATED CIRCUIT

(71) Applicant: STMicroelectronics (Rousset) SAS, Rousset (FR)

(72) Inventors: Pascal Fornara, Pourrieres (FR); Christian Rivero, Rousset (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 156 days.

(21) Appl. No.: 13/959,496

(22) Filed: Aug. 5, 2013

(65) Prior Publication Data
US 2013/0314150 A1 Nov. 28, 2013

Related U.S. Application Data

(62) Division of application No. 13/243,620, filed on Sep. 23, 2011, now Pat. No. 8,502,383.

(30) Foreign Application Priority Data

Oct. 18, 2010 (FR) ..................... 10 58474

(51) Int. Cl.
*H01L 23/34* (2006.01)
*H01L 23/00* (2006.01)

(52) U.S. Cl.
CPC ....... *H01L 23/576* (2013.01); *H01L 2924/0002* (2013.01)

(58) Field of Classification Search
CPC ......... H01L 21/48; H01L 21/40; H01L 23/34; H01L 35/02
See application file for complete search history.

(56) References Cited

U.S. PATENT DOCUMENTS

| | | | |
|---|---|---|---|
| 4,888,628 A | 12/1989 | Bergemont | |
| 5,191,405 A | 3/1993 | Tomita et al. | |
| 5,955,781 A | 9/1999 | Joshi et al. | |
| 6,188,011 B1 | 2/2001 | Nolas et al. | |
| 6,316,801 B1 | 11/2001 | Amanuma | |
| 6,327,225 B1 | 12/2001 | Okeya et al. | |
| 6,518,661 B1 | 2/2003 | Blish et al. | |

(Continued)

FOREIGN PATENT DOCUMENTS

| | | |
|---|---|---|
| DE | 10104219 A1 | 8/2002 |
| EP | 2259319 A1 | 12/2010 |
| JP | 2007-214285 A | 8/2007 |

OTHER PUBLICATIONS

Republique Francaise Institut National De La Propriete Industrielle, Rapport De Echerche Preliminaire (Preliminary Search Report); issued in French Patent Application No. 1058474 on May 26, 2011 (8 pages).

*Primary Examiner* — Kyoung Lee
(74) *Attorney, Agent, or Firm* — Slater & Matsil, L.L.P.

(57) ABSTRACT

An integrated circuit includes active circuitry disposed at a surface of a semiconductor body and an interconnect region disposed above the semiconductor body. A thermoelectric material is disposed in an upper portion of the interconnect region away from the semiconductor body. The thermoelectric material is configured to deliver electrical energy when exposed to a temperature gradient. This material can be used, for example, in a method for detecting the repackaging of the integrated circuit after it has been originally packaged.

31 Claims, 4 Drawing Sheets

(56) References Cited

U.S. PATENT DOCUMENTS

| | | |
|---|---|---|
| 6,541,298 B2 | 4/2003 | Shigenaka et al. |
| 6,559,538 B1 | 5/2003 | Pomerene et al. |
| 6,660,926 B2 | 12/2003 | Fleurial et al. |
| 6,790,744 B2 | 9/2004 | Chen et al. |
| 7,326,936 B2 | 2/2008 | Kawano et al. |
| 7,406,185 B2 | 7/2008 | Chou et al. |
| 7,463,502 B2 | 12/2008 | Stipe |
| 7,638,705 B2 | 12/2009 | Venkatasubramanian |
| 7,855,101 B2 | 12/2010 | Furman et al. |
| 8,330,269 B2 | 12/2012 | Stecher et al. |
| 8,461,035 B1 | 6/2013 | Cronquist et al. |
| 2006/0220252 A1 | 10/2006 | Yukawa et al. |
| 2010/0032748 A1 | 2/2010 | Edwards |
| 2010/0079959 A1* | 4/2010 | Letz ............... H01L 25/0657 361/717 |
| 2010/0308898 A1 | 12/2010 | Rivero et al. |
| 2011/0291012 A1* | 12/2011 | Takahashi ............ G01J 5/12 250/336.1 |
| 2012/0012895 A1 | 1/2012 | Or-Bach et al. |

\* cited by examiner

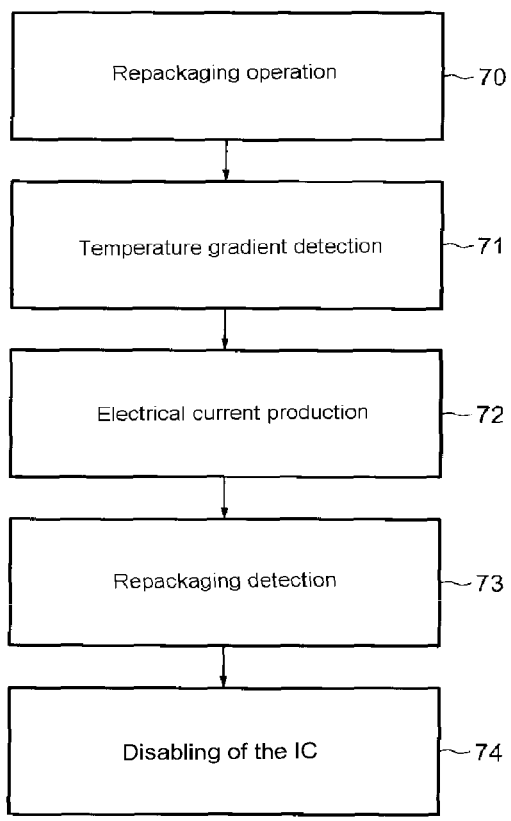
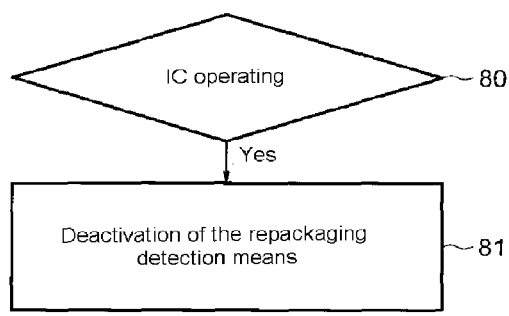

METHOD FOR DETECTING ELECTRICAL ENERGY PRODUCED FROM A THERMOELECTRIC MATERIAL CONTAINED IN AN INTEGRATED CIRCUIT

CROSS-REFERENCE TO RELATED APPLICATIONS

This is a divisional of U.S. patent Ser. No. 13/243,620, filed Sep. 23, 2011, which claims the priority benefit of French patent application number 10-58474, filed on Oct. 18, 2010, both of which are hereby incorporated by reference to the maximum extent allowable by law.

TECHNICAL FIELD

The invention relates to integrated circuits and more particularly to a way of detecting a repackaging of an integrated circuit after it has been originally packaged.

BACKGROUND

Illegal acts perpetrated on integrated circuits, consisting in repackaging an integrated circuit with a different reference, generally indicating a more advanced integrated circuit possessing better characteristics, have been observed. These illegal acts can be generally detected only after optical analysis of the packages or after X-ray analysis in order to check that the integrated circuit inside the package does indeed correspond to the reference inscribed on the package.

Such detection carried out a posteriori is expensive.

Conventionally, an integrated circuit comprises a part commonly referred to by those skilled in the art as the FEOL (front end of line) on which there is a second part commonly referred to by those skilled in the art as the BEOL (back end of line).

The FEOL is in fact the first part of the integrated circuit fabricated, this part comprising the usual active components such as, for example, transistors, resistors, etc. The FEOL generally includes all the various elements of the integrated circuit up to the first metallization layer.

The upper part of the integrated circuit, namely the BEOL, is that part of the integrated circuit in which the active components are interconnected by means of a system of interconnects comprising metallization levels forming interconnect lines or tracks, and vias. This BEOL generally starts with the first metallization level and it also includes the vias, the insulating layers and the contact pads placed on the upper part of the integrated circuit.

SUMMARY

According to one mode of implementation and one embodiment, the invention provides a method and an integrated circuit for the automatic and self-contained detection of repackaging of the integrated circuit.

The inventors have observed that when an integrated circuit is packaged, and therefore when it is repackaged, certain steps are carried out at high temperature and a large amount of heat is released near the integrated circuit and that, as a consequence, this thermal energy thus released can be detected by thermoelectric materials placed in the integrated circuit and thus be converted into an electrical current revealing that the integrated circuit has been repackaged.

Specifically, a thermoelectric material therefore enables electrical energy, and more precisely an electrical current, to be produced as a result of the thermal gradient to which it is exposed.

According to one aspect, the invention thus provides a method for detecting the repackaging of an integrated circuit after it has been originally packaged.

According to a general feature of this aspect, the repackaging detection comprises the detection of electrical energy produced from at least one thermoelectric material contained in at least one region exposed to a temperature gradient during the repackaging while the integrated circuit is not in operation.

The method may also further include definitively disenabling the integrated circuit when a repackaging is detected.

Advantageously, the method may further include deactivating the means for detecting a repackaging while the integrated circuit is operating.

At least one thermoelectric material is preferably installed in the interconnect part of the integrated circuit.

More particularly, at least one thermoelectric material may advantageously be installed beneath connection pads on the integrated circuit and/or in a zone adjacent to the peripheral surface of the integrated circuit. Thus, the thermoelectric material is as close as possible to the points of localized heating during repackaging.

According to another aspect, the invention provides an integrated circuit that comprises a device for detecting repackaging, which is designed to detect a repackaging of the integrated circuit after it has been originally packaged and includes at least one thermoelectric material placed in at least one region designed to be exposed to at least one temperature gradient resulting from the integrated circuit being repackaged while the integrated circuit is not in operation. The detection device is capable of detecting electrical energy delivered by the at least one thermoelectric material exposed to the temperature gradient or gradients.

The repackaging detection device may comprise a memory device capable of memorizing the energy produced by a first packaging, corresponding to the original packaging. The detection device may also comprise a comparison unit capable of comparing the energy produced subsequently while the integrated circuit is not in operation with the energy memorized during the first packaging operation so as to determine whether this is energy produced following a repackaging operation.

Preferably, the integrated circuit includes inter alia control circuitry designed to disenable the integrated circuit following detection of repackaging.

Advantageously, the integrated circuit includes a deactivation unit designed to deactivate the repackaging detection device while the integrated circuit is operating.

The thermoelectric material or materials may advantageously be installed beneath connection pads on the integrated circuit and/or in a zone adjacent to the peripheral surface of the integrated circuit.

BRIEF DESCRIPTION OF THE DRAWINGS

Other advantages and features of the invention will become apparent on examining the detailed description of entirely non-limiting embodiments and the appended drawings in which:

FIG. 7 illustrates the main steps of a way of implementing the method according to the invention;

FIG. 8 illustrates additional steps of deactivating the detection means while the integrated circuit is operating;

DETAILED DESCRIPTION OF ILLUSTRATIVE EMBODIMENTS

Figure 1:
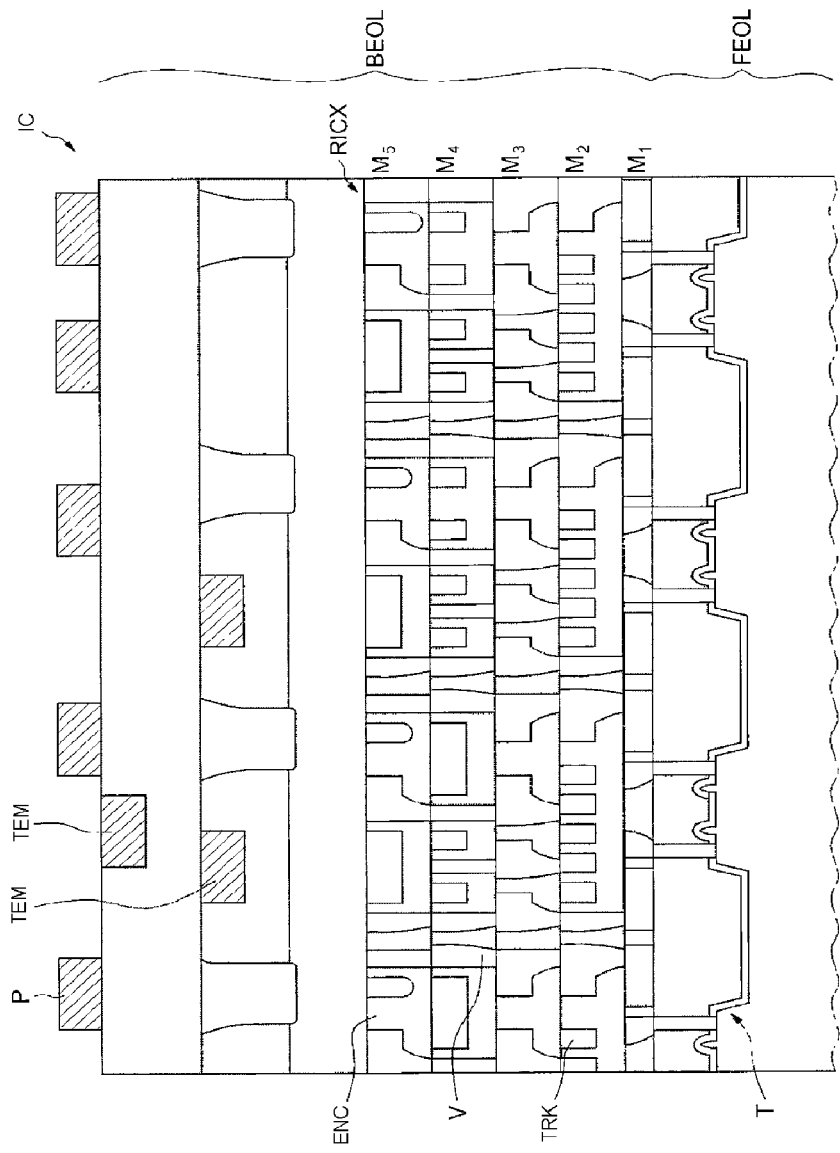
FIG. 1 illustrates schematically an example of the structure of an integrated circuit.

FIG. 1 shows an integrated circuit, referenced IC, comprising an active part that includes active components, for example a transistor T. This active part is commonly referred to by those skilled in the art as the FEOL.

This active part is surmounted by a system of interconnects RICX intended for the interconnection of the various active components of the integrated circuit IC and for connection with contact pads P placed on the upper part of the integrated circuit IC.

This system of interconnects RICX conventionally comprises an array of electrically conducting tracks, for example made of copper or aluminum, referenced TRK. These tracks are distributed over several metallization levels $M_i$, five of which are shown in FIG. 1.

The system of interconnects also includes vias V, which are electrically conducting orifices connecting certain tracks on one metallization level to certain tracks on the adjacent metallization level. Finally, all of the tracks TRK and vias V are electrically isolated from one another by an insulating encapsulation ENC or interlayer dielectric ILD. Such a dielectric may be for example silicon dioxide.

When this integrated circuit IC is being packaged, certain packaging steps release a large amount of heat, creating a temperature gradient at least on the surface of the integrated circuit. They are especially steps of soldering between the leadframe and the integrated circuit, of preheating the leadframe and of encapsulating the integrated circuit in a package. At least one thermoelectric material, and in practice one and the same thermoelectric material, is therefore provided in one or even more regions exposed to such a temperature gradient so as to detect a possible repackaging.

The integrated circuit IC therefore also includes here thermoelectric materials TEMs mounted in the interconnect part (BEOL). In practice, according to one embodiment, the regions in which the thermoelectric material is placed are close to the external surfaces of the integrated circuit IC and especially the connection pads P where a large temperature rise occurs while the connections are being soldered during repackaging.

Any thermoelectric material is suitable for producing the energy resulting from the temperature gradient to which the material is exposed. In particular, mention may be made of bismuth telluride ($Bi_2Te_3$) or silicon-germanium alloys, or else materials of the skutterudite family. Skutterudites are compounds having a cubic structure formed from a lattice cell of the $MX_3$ type (where M denotes a transition metal and X may be arsenic, phosphorus or antimony) with, at the center of this lattice cell, a large cage into which heavy atoms, especially rare earths, may be inserted.

FIGS. 2 to 6 illustrate steps of an example of a region containing a thermoelectric material TEM, for example, in the upper metallization levels of the integrated circuit.

Figure 2:
FIGS. 2 to 6 illustrate an example of thermoelectric regions in an integrated circuit according to the invention.

In FIG. 2, the reference P denotes that part of the integrated circuit already produced, just prior to the production of the metallization level Mx. The part P includes, especially above it, an etch stop layer. The metal level Mx is then produced in a conventional manner.

More precisely, as illustrated in FIG. 2, an insulating layer C1, for example made of silicon dioxide, is deposited on the etch stop layer, this insulating layer being intended to form the encapsulation ENC between the future tracks.

Figure 3:
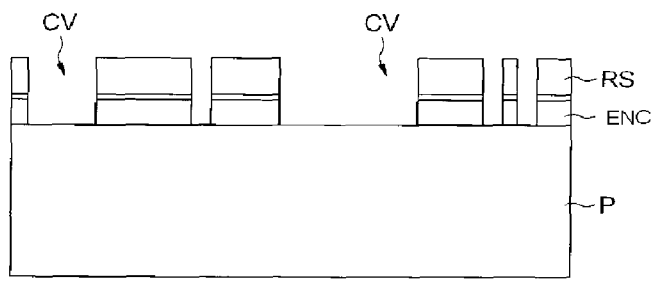

Next, after a layer is resist RS has been deposited and the positions of the future metal tracks TRK have been defined by photolithography and irradiation of the resist, a conventional etching operation, known per se, is carried out on the layer C1 through the resist mask RS so as to form cavities CV (FIG. 3).

Figure 4:
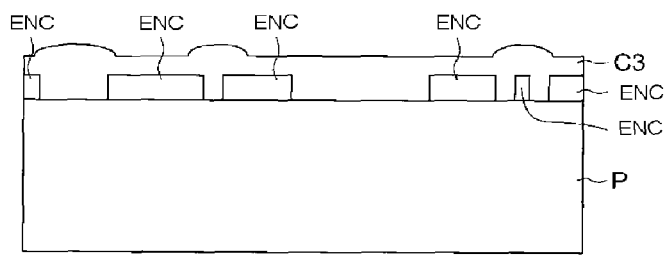

Next, a layer of metal C3, for example made of copper, is deposited so as to fill the cavities CV (FIG. 4).

Figure 5:
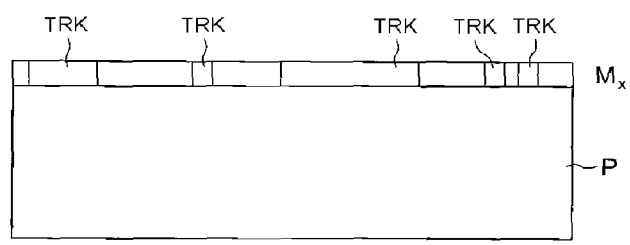

Next, after chemical-mechanical polishing, the configuration illustrated in FIG. 5 with the formation of the metal level Mx comprising the metal tracks TRK encapsulated by the insulating encapsulation ENC is obtained.

The regions RG or trenches containing the thermoelectric material TEM may be produced in the metallization level Mx by steps similar to those that have just been described. More precisely, in such an eventuality, to define the positions of the various trenches, a further step of photolithography and etching of the material of the layer C1 placed between the tracks TRK is also carried out so as to form cavities intended to receive the thermoelectric material TEM.

Figure 6:
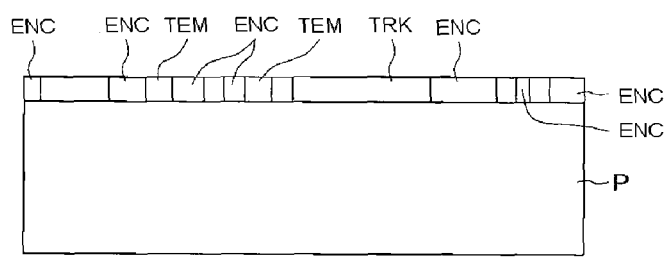

Next, a layer of this thermoelectric material is deposited so as to fill the cavities and a chemical-mechanical polishing operation is carried out so as to obtain the TEM-filled cavities (FIG. 6).

In the example that has just been described, the metal tracks were formed by etching the dielectric and filling with metal. As a variant, these tracks could be formed by depositing a metal, this metal then being etched, for example, when aluminum is used. The same could apply for the production of the regions of thermoelectric material, namely the formation of a layer of the thermoelectric material followed by the etching of this material.

Such a solution may be envisaged, for example, when bismuth telluride is used. More precisely, a layer of bismuth telluride may be formed by conventional chemical vapor deposition or else by a known MBE (molecular beam epitaxy) technique. The patterns of thermoelectric material may then be conventionally defined by photolithography followed by plasma etching.

The metal tracks and the patterns of thermoelectric material are then covered with an insulating encapsulation such as a dielectric.

As illustrated in FIG. 7, during a repackaging operation 70, at least one step of the packaging results in a rise in temperature (step 71), i.e., a temperature gradient, that can be detected by a thermoelectric material. This thermoelectric material then produces an electrical current (step 72) indicating that repackaging has been detected (step 73), while the integrated circuit IC is not being powered.

An indication representative of the presence of this electrical current can then, for example, be stored in a non-volatile memory.

It would also be possible in response to this detection to make the integrated circuit inoperable (step 74).

Moreover, although this is not essential, it is also possible to deactivate the means for detecting the production of electrical energy, while the integrated circuit is in operation, so that any detection of heat during operation of the integrated circuit is not interpreted as the detection of a repackaging (steps 80 and 81, FIG. 8).

Figure 9:
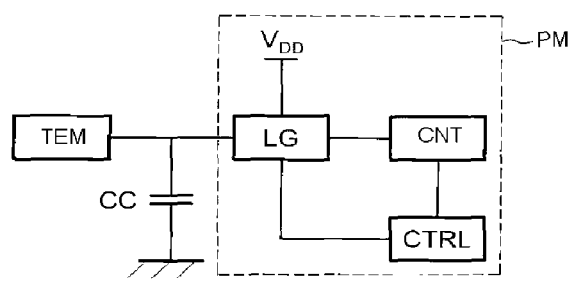
FIG. 9 shows an example of a detection device according to a first embodiment.

FIG. 9 shows an example of detection device (or detection circuit) that can be used for detecting a repackaging according to a first embodiment.

The detection device comprises at least one thermoelectric material TEM producing an electrical current when a temperature gradient is detected.

A capacitor CC is connected between the material TEM and ground. It is also connected to a processor PM, which comprises a logic circuit LG, a counter CNT and a control circuit CTRL, for example a microcontroller.

When the integrated circuit is not being supplied, as it is not in operation (no voltage $V_{DD}$ available), the logic circuit LG behaves as an open switch. The production of electrical energy by the thermoelectric material TEM then allows the capacitor CC to be charged.

In operation, the logic circuit LG behaves as a closed switch, enabling the capacitor to be discharged and the counter to be incremented. Once the counter has been incremented, the microcontroller again opens the switch LG, thus deactivating the processor for taking into account any energy production by the thermoelectric material TEM during operation of the integrated circuit.

The microcontroller then reads the value of the counter CNT.

During the original packaging operation, the counter is set to a reference value. When a repackaging operation takes place, the value of the counter is different from the initial value.

The presence of a value different from the initial value is representative of a repackaging. The microcontroller can then make the integrated circuit inoperable by cutting off the power supply, for example by the blowing of a fuse.

Figure 10:
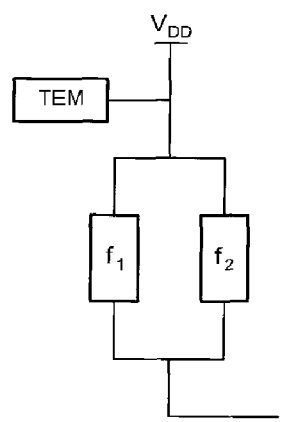
FIG. 10 shows an example of a detection device according to a second embodiment.

FIG. 10 shows an example of a detection device that can be used for detecting a repackaging according to a second embodiment.

The repackaging detection device comprises at least one thermoelectric material TEM producing an electrical current when a temperature gradient is detected. The size of the thermoelectric zone is chosen so as to produce a large current, well above the current consumed by the integrated circuit in operation, when heat is produced during a repackaging operation. The detection device comprises a first fuse $f_1$ and a second fuse $f_2$ connected together in parallel. The combination is coupled to the output of the thermoelectric material TEM. The fuse $f_1$ has a lower breakdown voltage than that of $f_2$.

The integrated circuit may be set, during the original packaging, by the fuse $f_1$ blowing, caused by the production of a first electrical current produced by the thermoelectric material TEM following the detection of a temperature gradient.

The supply voltage $V_{DD}$ is coupled to the integrated circuit via the combination formed by the two fuses $f_1$ and $f_2$ in parallel.

Once the integrated circuit has been set, it can still operate because the supply current is delivered via the fuse $f_2$, which is designed not to blow for electrical currents flowing during the operation of the integrated circuit.

When a repackaging operation takes place, the thermoelectric material detects a temperature gradient and then produces a large electrical current that will cause the fuse $f_2$ to blow. The blowing of this second fuse then cuts off the power supply for the integrated circuit which, as a consequence, is made definitively inoperable.

The fuses $f_1$ and $f_2$ are chosen so as to blow for a current of $I_{TEM}/2$ and $I_{TEM}$ respectively, where the current $I_{TEM}$ corresponds to the current delivered by the thermoelectric material TEM. This current is greater than the standard operating current of the integrated circuit.

What is claimed is:

1. A method for detecting a repackaging of an integrated circuit after it has been originally packaged, the method comprising:

detecting electrical energy produced from at least one thermoelectric material contained in at least one region exposed to a temperature gradient during the repackaging while the integrated circuit is not in operation.

2. The method according to claim 1, further comprising permanently disabling the integrated circuit when the repackaging is detected.

3. The method according to claim 2, wherein permanently disabling the integrated circuit comprises blowing a fuse.

4. The method according to claim 3, wherein permanently disabling the integrated circuit comprises blowing a fuse to prevent power from being supplied to at least a portion of the integrated circuit.

5. The method according to claim 1, further comprising storing an indication that electrical energy produced from at least one thermoelectric material has been detected.

6. The method according to claim 5, wherein storing the indication comprises storing the indication in a non-volatile memory.

7. The method according to claim 5, wherein storing the indication comprises storing the indication using a counter.

8. The method according to claim 1, further comprising blowing a fuse after detecting the electrical energy produced from the at least one thermoelectric material.

9. The method according to claim 1, wherein the detecting is prevented during operation of the integrated circuit.

10. The method according to claim 1, wherein the at least one thermoelectric material is located in an interconnect portion of the integrated circuit.

11. The method according to claim 10, wherein the at least one thermoelectric material is located beneath at least one connection pads of the integrated circuit.

12. The method according to claim 11, wherein the at least one thermoelectric material is also located in a zone adjacent a peripheral region of the integrated circuit.

13. The method according to claim 10, wherein the at least one thermoelectric material is located in a zone adjacent a peripheral region of the integrated circuit.

14. The method according to claim 10, wherein the at least one thermoelectric material is located in a layer that also includes an uppermost metallization.

15. An integrated circuit comprising:

means for detecting repackaging of the integrated circuit after it has been originally packaged, the means for detecting repackaging including at least one thermoelectric material located in at least one region that will be exposed to at least one temperature gradient that results when the integrated circuit is repackaged while the integrated circuit is not in operation; and detection means for detecting electrical energy delivered by the at least one thermoelectric material exposed to the temperature gradient or gradients.

16. The integrated circuit according to claim 15, further comprising means for disabling the integrated circuit following detection of repackaging.

17. The integrated circuit according to claim 15, further comprising means for deactivating the means for detecting repackaging while the integrated circuit is operating.

18. The integrated circuit according to claim 15, wherein the at least one thermoelectric material is located beneath connection pads of the integrated circuit.

19. The integrated circuit according to claim 15, wherein the at least one thermoelectric material is located in a zone adjacent to a peripheral surface of the integrated circuit.

20. A method of making integrated circuit, the method comprising:

forming active circuitry at a surface of a semiconductor body;

forming metal lines above the active circuitry to electrically interconnect portions of the active circuitry, the metal lines being part of an interconnect region; and forming a thermoelectric material above the semiconductor body away from the active circuitry within the metal lines;

wherein the active circuitry includes a detection circuit configured to detect electrical energy delivered by the thermoelectric material when the thermoelectric material is exposed to a temperature gradient and a deactivation circuit configured to deactivate the detection circuit when the integrated circuit is in a normal operating mode.

21. The method according to claim 20, wherein forming the thermoelectric material comprises forming the thermoelectric material within the metal lines.

22. The method according to claim 21, wherein forming the thermoelectric material comprises performing a damascene process.

23. The method according to claim 20, wherein the active circuitry further comprises disablement circuitry configured to permanently disable the integrated circuit following detection of the electrical energy delivered by the thermoelectric material.

24. The method according to claim 20, further comprising forming connection pads at an outer surface of the integrated circuit, wherein the thermoelectric material is located beneath the connection pads.

25. The method according to claim 20, wherein the thermoelectric material is located in a zone adjacent to a peripheral surface of the integrated circuit.

26. The method according to claim 20, wherein the thermoelectric material is located in a layer that also includes an uppermost interconnect line.

27. The method according to claim 20, wherein the thermoelectric material is located above a layer that includes an uppermost interconnect line.

28. The method according to claim 20, wherein the thermoelectric material comprises bismuth telluride.

29. The method according to claim 20, wherein the thermoelectric material comprises a silicon germanium alloy.

30. The method according to claim 20, wherein the thermoelectric material comprises a material of a skutterudite family.

31. The method according to claim 20, wherein the thermoelectric material comprises a compound having a cubic structure formed from a lattice cell of the MX3 type, where M denotes a transition metal and X is arsenic, phosphorus or antimony, wherein the lattice cell includes a cage with a rare earth atom.

* * * * *